(12) United States Patent
Radke

(10) Patent No.: US 7,512,909 B2
(45) Date of Patent: Mar. 31, 2009

(54) READ STROBE FEEDBACK IN A MEMORY SYSTEM

(75) Inventor: William H. Radke, San Francisco, CA (US)

(73) Assignee: Micron Technology, Inc., Boise, ID (US)

( * ) Notice: Subject to any disclaimer, the term of this patent is extended or adjusted under 35 U.S.C. 154(b) by 317 days.

(21) Appl. No.: 11/513,889

(22) Filed: Aug. 31, 2006

(65) Prior Publication Data

US 2008/0056027 A1    Mar. 6, 2008

(51) Int. Cl.
*G06F 17/50* (2006.01)
(52) U.S. Cl. .............................................. 716/1; 716/6
(58) Field of Classification Search ...................... 716/1, 716/6; 711/158, 167, 170; 365/194
See application file for complete search history.

(56) References Cited

U.S. PATENT DOCUMENTS

| 6,456,544 | B1 * | 9/2002 | Zumkehr ..................... 365/193 |
| 6,745,275 | B2 | 6/2004 | Chang |
| 6,788,566 | B1 | 9/2004 | Bhavnagarwala et al. |
| 6,815,525 | B2 | 11/2004 | DeBruin |
| 6,957,399 | B2 * | 10/2005 | Emberling et al. ............. 716/1 |
| 7,394,721 | B1 * | 7/2008 | Vemula .................. 365/189.05 |

* cited by examiner

*Primary Examiner*—Vu A Le
(74) *Attorney, Agent, or Firm*—Leffert Jay & Polglaze, P.A.

(57) ABSTRACT

A controller circuit is coupled to a memory device over a data/IO bus and a control bus. The controller circuit generates a read enable signal that is transmitted to the memory device to instruct the memory device to drive data onto the data/IO bus. The read enable signal is fed back to the controller circuit that then uses the fed back signal to read the data from the data/IO bus.

18 Claims, 5 Drawing Sheets

READ STROBE FEEDBACK IN A MEMORY SYSTEM

TECHNICAL FIELD OF THE INVENTION

The embodiments of the present invention relate generally to memory devices and particularly to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. Generally, these can be considered either volatile or non-volatile memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Increased memory system performance typically requires increased memory speed as well. For example, as memory controller speed increases, the memory has to be able to provide data to the controller quickly enough to prevent the memory from degrading total system performance.

For the reasons stated above, and for other reasons stated below which will become apparent to those skilled in the art upon reading and understanding the present specification, there is a need in the art for improved performance in communication between a memory device and a memory controller.

DETAILED DESCRIPTION

Figure 1:
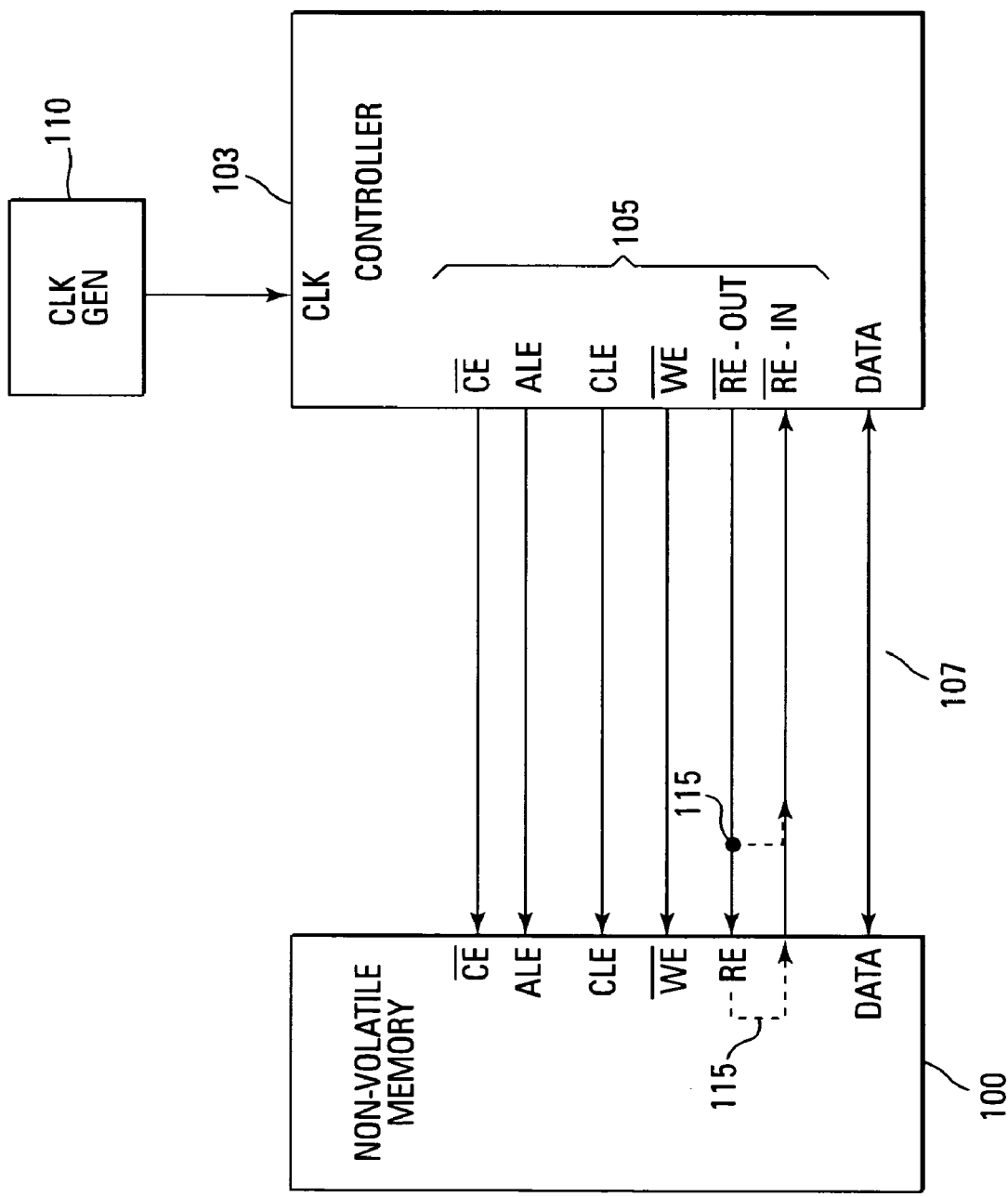
FIG. 1 shows a block diagram of one embodiment of read strobe feedback in a memory system.

In the following detailed description, reference is made to the accompanying drawings that form a part hereof and in which is shown, by way of illustration, specific embodiments. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of one embodiment of read strobe feedback in a memory system. This figure represents a typical system comprising a controller circuit 103, such as a microprocessor, a memory device 100, such as a non-volatile memory, and a clock generating circuit 110 that generates a system clock signal. A more detailed discussion of a typical system is illustrated in greater detail in FIG. 3.

The non-volatile memory 100 of FIG. 1 may be one of many different architectures of flash memory. These can include NAND, NOR, AND, or other flash memory architecture types.

The controller 103 generates the control signals 105 that are responsible for controlling operation of the non-volatile memory device 100. The control signals 105 illustrated in FIG. 1 are for purposes of illustration only since not all of the control signals may be shown and the type of memory determines which control signals are necessary. The group of control signals 105 shown are part of the control bus interface protocol required for operation of the memory device 100.

The CE* signal is the active low chip enable. This signal gates transfers between the controller or host system and the non-volatile memory device 100. CE* is asserted by the controller 103 prior to beginning a memory operation such as program or erase operations. Once the memory device has started the operation, the chip enable signal can be de-asserted.

The ALE signal is the active high address latch enable. This signal indicates to the memory device 100 that the I/O lines of the memory contain valid address information. While ALE is active (i.e., logical high), address information can be transferred from the controller 103 to the on-chip address register. In one embodiment, the addresses are latched into the register upon transition of another signal such as the write enable signal WE*.

The WE* is the active low write enable signal that is used to gate transfers of data/addresses from the controller 103 to the non-volatile memory device 100. In one embodiment, a low-to-high transition of this signal provides the latch indication. Data are written from the controller 103 to the non-volatile memory 100 on the rising edge of WE* when CE*, CLE, and ALE are all at a logic low.

The CLE signal is the command latch enable. This active high signal provides an indication to the memory device 100 that command data is available on the I/O lines. The WE* signal can be used to gate the commands into the memory command register.

The RE* signal is the read enable strobe. This is an active low signal that gates data transfers from the memory device 100, over the data or I/O bus 107, to the controller 103. RE* instructs the memory device 100 to drive requested data onto the data bus 107. The controller 103 generates the RE*-OUT signal after a read command has been sent to the memory 100 over the I/O lines using the CLE and WE* signals. The read command can be a two byte hexadecimal command to the memory controller/state machine instructing it to perform a read operation. Since this command may vary for different memory devices, it is not discussed further.

The non-volatile memory 100 read timing is specified relative to the RE* signal at the memory pins. Due to propagation delays, the controller 103 only knows what the RE*-OUT signal looks like inside the controller 103 at the time it is generated. Neither of these two timings, at RE*-OUT generation or RE* at the memory pins, matches the timing of the data as it arrives in the controller 103, from the memory, during a read operation.

The non-volatile memory device 100 feeds back the RE* signal 115 to the controller 103. This feedback provides the controller 103 with a more accurate estimate of the arrival of byte-oriented data at the controller 103 so that the timing relationship can be maintained between RE*-OUT and the bytes of memory read data as it is processed in the controller 103. The feedback signal becomes the RE*-IN signal at the controller 103.

In one embodiment, the RE* strobe is fed back to the controller 103 through the memory device 100. An alternate embodiment feeds back the RE* strobe outside of the memory device such as having a jumper trace or wire between memory device pins. One embodiment feeds the RE* strobe back substantially simultaneously with the memory receiving it.

Figure 2:
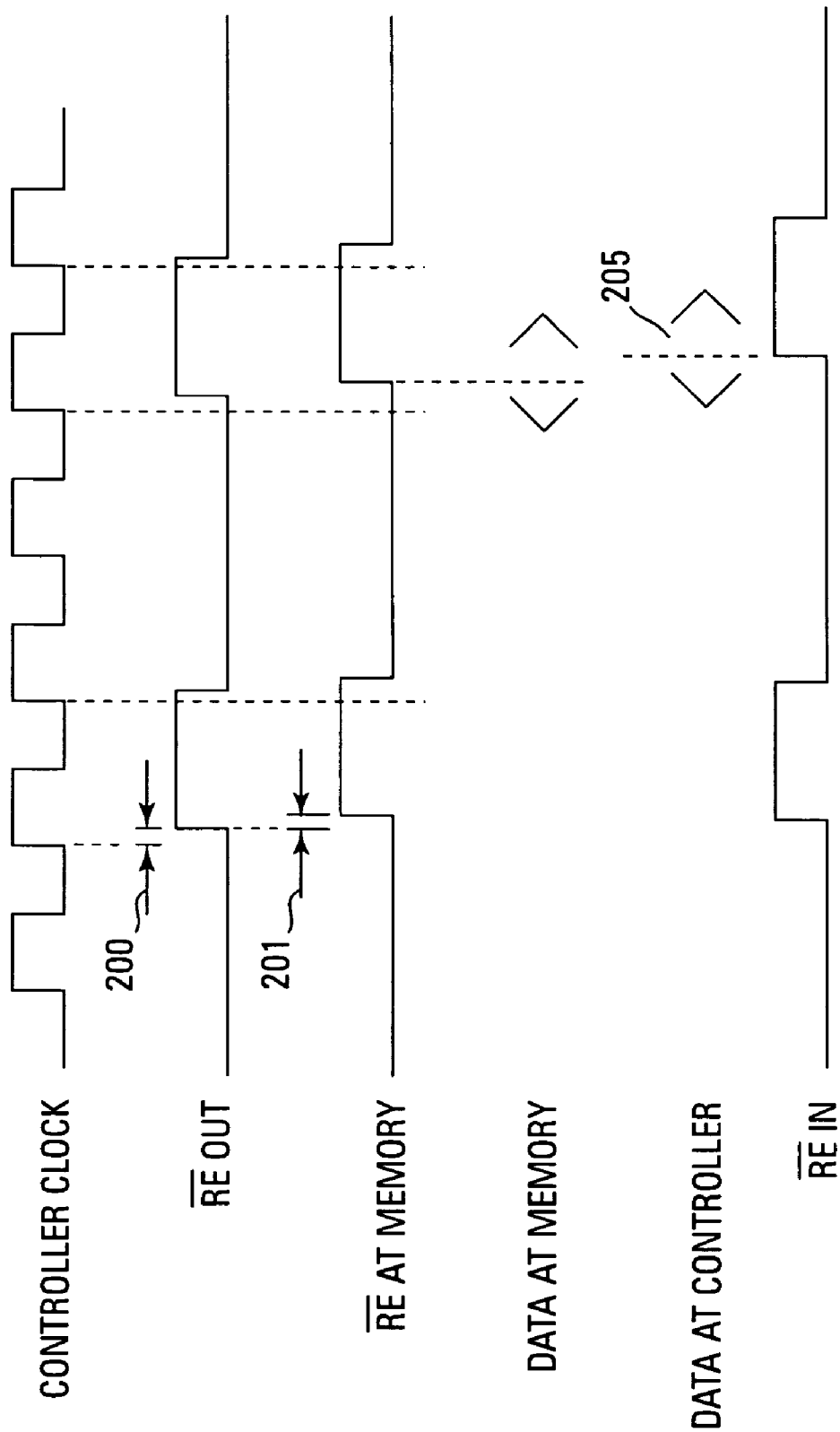
FIG. 2 shows a timing diagram in accordance with the embodiment of FIG. 1.

FIG. 2 illustrates a timing diagram showing the relationships of RE* signals and data of FIG. 1. The system or controller clock is provided to the controller by a clock generation circuit. Operation of the controller in the memory system is synchronized to this clock.

The RE*-OUT signal is generated by the controller as discussed previously. There is a slight delay 200 from the rising clock edge to the rising edge of the RE* signal. This low-to-high transition of RE*-OUT informs the controller that the data is valid on the pins of the memory device. The RE*-OUT signal also experiences a propagation delay 201 between the controller generated signal and the input pin of the memory device.

The high-to-low transition of RE*-IN causes the controller to read the data. The data output from the memory on the data bus is typically valid a few nanoseconds before and after this transition.

FIG. 2 shows that the DATA AT CONTROLLER is not valid at the controller clock edges. However, the data is valid 205 with the RE* feedback from the memory device (i.e., RE*-IN). Thus, the RE* feedback provides the controller a more accurate estimate of data arrival on a per-byte basis than is provided by the controller clock.

Figure 5:
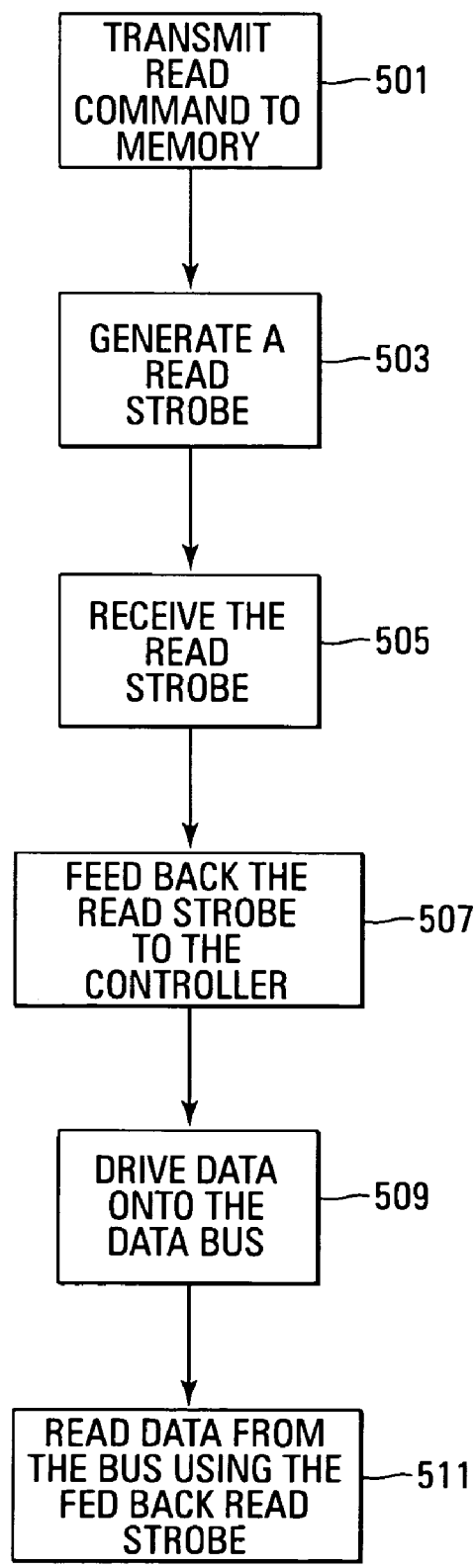
FIG. 5 shows a flowchart of one embodiment of a read method.

FIG. 5 illustrates a flowchart of one embodiment of a method for performing a read operation in accordance with the read strobe feedback as previously described. The controller circuit initiates a read operation by transmitting a read command to the memory device 501. The controller generates the read strobe RE* 503 that is received by the memory device 505.

The RE* signal is fed back to the controller circuit 507 and the memory device drives the selected data onto the data bus 509. As is well known in the art, the data is selected by the address provided by the controller circuit over address lines or the I/O lines. The controller circuit uses the fed back RE* signal to read the data from the data bus 511.

Figure 3:
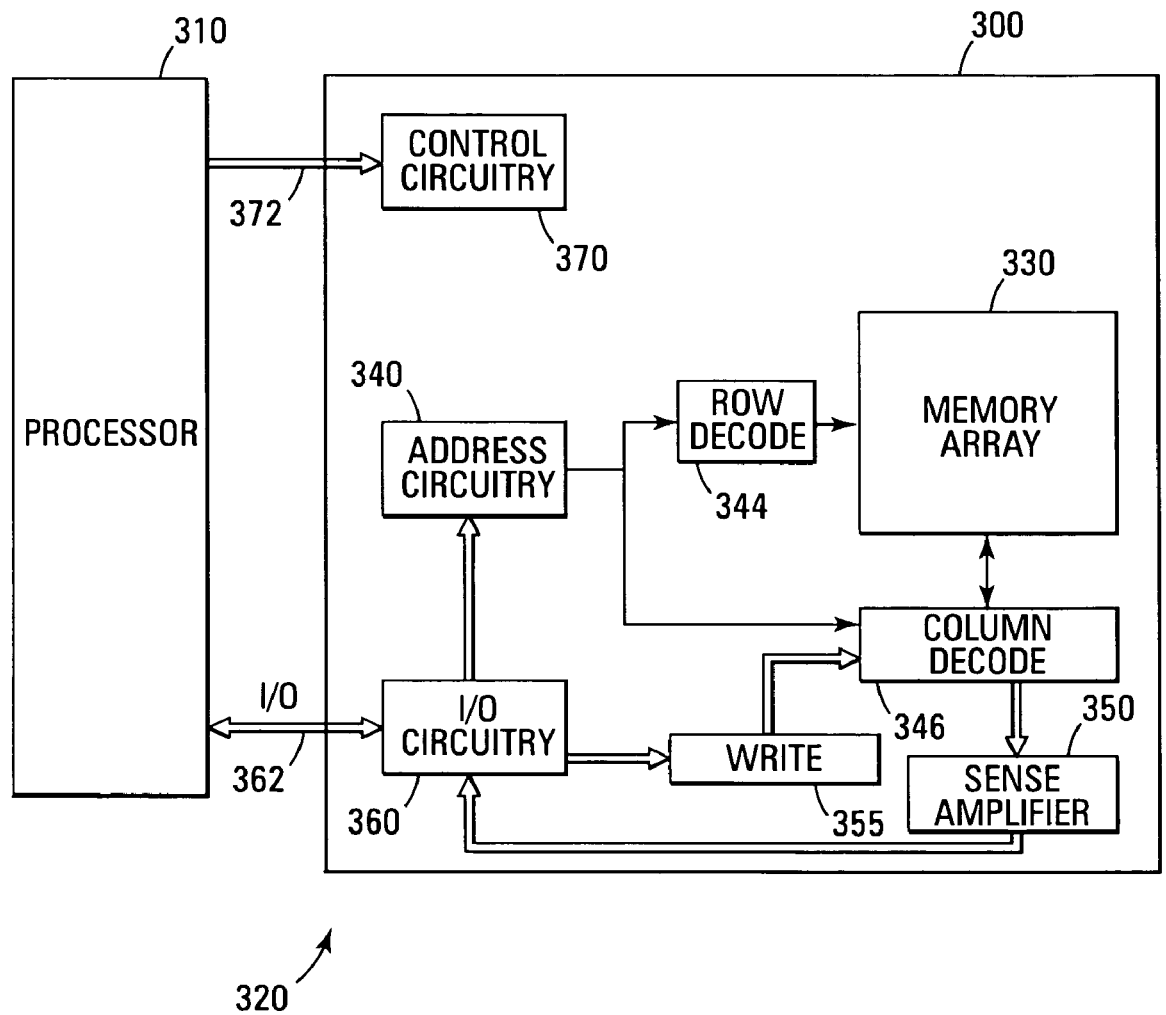
FIG. 3 shows a block diagram of one embodiment of a memory system.

FIG. 3 illustrates a functional block diagram of a memory device 300 that can incorporate a non-volatile memory device as previously described. The memory device 300 is coupled to a control device 310. The control device 310 may be a microprocessor, a memory controller or some other type of controlling circuitry. The memory device 300 and the processor 310 form part of an electronic system 320. The memory device 300 has been simplified to focus on features of the memory that are helpful in understanding the present invention.

The memory device includes an array of memory cells 330 that can include flash memory cells or some other type of non-volatile memory cells. The memory array 330 is arranged in banks of rows and columns. The control gates of each row of memory cells is coupled with a wordline while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 340 is provided to latch address signals provided on address input connections A0-Ax 342. Address signals are received and decoded by a row decoder 344 and a column decoder 346 to access the memory array 330. It will be appreciated by those skilled in the art, with the benefit of the present description, that the number of address input connections depends on the density and architecture of the memory array 330. That is, the number of addresses increases with both increased memory cell counts and increased bank and block counts.

The memory device 300 reads data in the memory array 330 by sensing voltage or current changes in the memory array columns using sense amplifier/buffer circuitry 350. The sense amplifier/buffer circuitry, in one embodiment, is coupled to read and latch a row of data from the memory array 330. Data input and output buffer circuitry 360 is included for bi-directional data communication over a plurality of data connections 362 with the controller 310. Write circuitry 355 is provided to write data to the memory array.

Control circuitry 370 decodes signals (e.g., ALE, CLE, CE*, RE*) provided on control connections 372 from the processor 310. These signals are used to control the operations on the memory array 330, including data read, data write, and erase operations. The control circuitry 370 may be a state machine, a sequencer, or some other type of controller.

The memory device illustrated in FIG. 3 has been simplified to facilitate a basic understanding of the features of the memory and is for purposes of illustration only. A more detailed understanding of internal circuitry and functions of memories are known to those skilled in the art. Alternate embodiments may include a memory cell of one embodiment of the present invention in other types of electronic systems.

Figure 4:
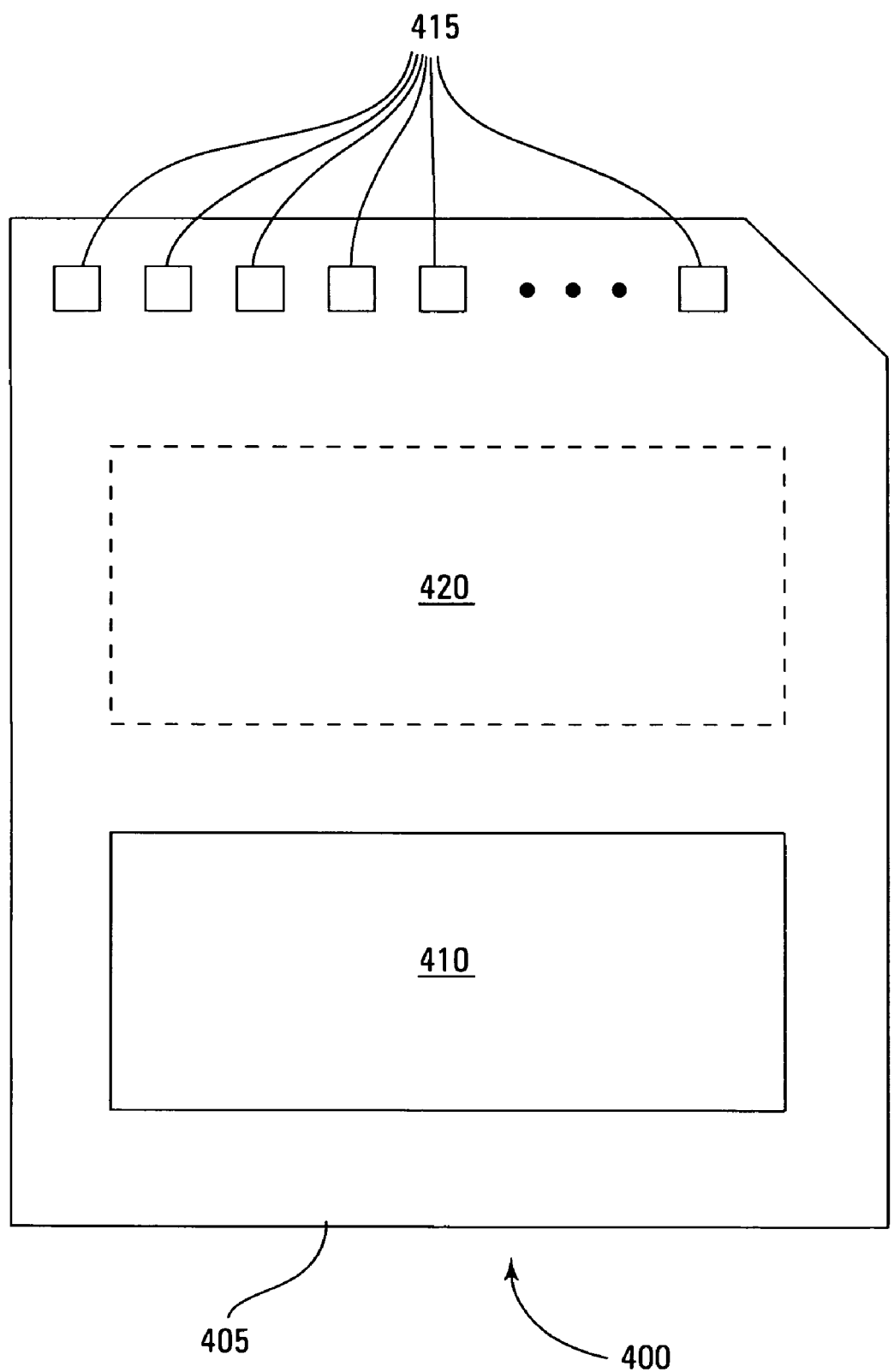
FIG. 4 shows a block diagram of one embodiment of a memory module.

FIG. 4 is an illustration of a memory module 400 that incorporates memory cell embodiments as discussed previously. Although memory module 400 is illustrated as a memory card, the concepts discussed with reference to memory module 400 are applicable to other types of removable or portable memory, e.g., USB flash drives. In addition, although one example form factor is depicted in FIG. 4, these concepts are applicable to other form factors as well.

Memory module 400 includes a housing 405 to enclose one or more memory devices 410 of the present invention. The housing 405 includes one or more contacts 415 for communication with a host device. Examples of host devices include digital cameras, digital recording and playback devices, PDAs, personal computers, memory card readers, interface hubs and the like. For some embodiment, the contacts 415 are in the form of a standardized interface. For example, with a USB flash drive, the contacts 415 might be in the form of a USB Type-A male connector. In general, however, contacts 415 provide an interface for passing control, address and/or data signals between the memory module 400 and a host having compatible receptors for the contacts 415.

The memory module 400 may optionally include additional circuitry 420. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410. The additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

CONCLUSION

In summary, the embodiments discussed herein provide a memory system with the ability to transfer data more quickly between a non-volatile memory and a memory controller. The RE* strobe is fed back from the memory device to the controller to provide the controller with a more accurate timing of when the data is valid on a byte basis.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory system comprising:
   a controller circuit for generating a read enable signal; and
   a memory device coupled to the controller circuit and operating in response to the read enable signal wherein the read enable signal is fed back to the controller circuit through the memory device.

2. The system of claim 1 wherein the memory device is a flash memory device.

3. The system of claim 2 wherein the flash memory device is comprised of one of a NAND architecture, a NOR architecture, or an AND architecture.

4. The system of claim 1 wherein the controller circuit is adapted to use the read enable signal to determine when data from the memory device is valid.

5. The system of claim 1 wherein the memory device is adapted to use the read enable signal during a read operation to drive data onto a data bus.

6. The system of claim 1 and further including a clock generation circuit coupled to the controller circuit for generating a clock signal.

7. A non-volatile memory system comprising:
   a controller circuit for generating a read strobe that indicates a read operation; and
   a non-volatile memory device coupled to the controller circuit over a control bus and a data bus, the memory device driving read data onto the data bus in response to the received read strobe wherein the read strobe is fed back to the controller circuit such that the controller circuit uses the fed back read strobe to clock in the read data.

8. The system of claim 7 wherein the read strobe is part of the control bus.

9. The system of claim 7 wherein low-to-high transitions of the read strobe and the fed back read strobe are separated by a propagation delay.

10. The system of claim 7 wherein a high-to-low transition of the received read strobe starts a read operation in the non-volatile memory device.

11. A method for reading data in a memory system comprising a memory device coupled to a controller circuit over a data bus, the method comprising:
    generating an original read enable signal in the controller circuit;
    receiving the read enable signal;
    feeding back the received read enable signal through the memory device to the controller circuit; and
    reading data from the data bus in response to the fed back read enable signal.

12. The method of claim 11 wherein the fed back read enable signal and the original read enable signal are separated by a propagation delay.

13. The method of claim 11 wherein feeding back the received read enable signal is performed substantially simultaneously with receiving the read enable signal.

14. A method for reading data in a memory system comprising a memory device coupled to a controller circuit over control and data buses, the method comprising:
    the controller circuit transmitting a read operation command to the memory device over the control bus;
    the controller circuit generating an original read enable signal;
    the memory device receiving the read enable signal and feeding the received read enable signal back to the controller circuit;
    the memory device driving data onto the data bus in response to the received read enable signal; and
    the controller circuit reading data from the data bus in response to the fed back read enable signal.

15. A memory module comprising:
    a controller for generating a read enable signal that indicates start of a read operation;
    at least two non-volatile memory devices, each coupled to the controller circuit and operating in response to the read enable signal wherein the read enable signal is fed back to the controller circuit; and
    a plurality of contacts configured to provide selective contact between the memory devices and a host system.

16. The module of claim 15 wherein the at least two non-volatile memory devices are flash memory devices arranged in a NAND configuration.

17. A memory module comprising:

a controller for generating a read enable signal that indicates start of a read operation;

a non-volatile memory device coupled to the controller circuit and operating in response to the read enable signal wherein the read enable signal is fed back to the controller circuit;

a housing for enclosing the memory device; and a plurality of contacts coupled to the housing and configured to provide selective contact between the memory device and a host system.

18. The module of claim 17 wherein the memory device is a non-volatile USB memory device.

* * * * *

UNITED STATES PATENT AND TRADEMARK OFFICE
CERTIFICATE OF CORRECTION

PATENT NO. : 7,512,909 B2  Page 1 of 1
APPLICATION NO. : 11/513889
DATED : March 31, 2009
INVENTOR(S) : Radke It is certified that error appears in the above-identified patent and that said Letters Patent is hereby corrected as shown below:

On the title page, item (75), in "Inventors", in column 1, line 1, delete "San Francisco," and insert -- Los Gatos, --, therefor.

Signed and Sealed this

Thirtieth Day of June, 2009

JOHN DOLL
*Acting Director of the United States Patent and Trademark Office*